(12) United States Patent
Fan

(10) Patent No.: US 12,211,967 B2
(45) Date of Patent: Jan. 28, 2025

(54) LIGHT-EMITTING DISPLAY DEVICE AND METHOD OF MANUFACTURING THE SAME

(71) Applicant: Wen-Cheng Fan, Zhubei (TW)

(72) Inventor: Wen-Cheng Fan, Zhubei (TW)

( * ) Notice: Subject to any disclaimer, the term of this patent is extended or adjusted under 35 U.S.C. 154(b) by 449 days.

(21) Appl. No.: 17/532,655

(22) Filed: Nov. 22, 2021

(65) Prior Publication Data

US 2022/0173294 A1 Jun. 2, 2022

Related U.S. Application Data

(60) Provisional application No. 63/119,269, filed on Nov. 30, 2020.

(30) Foreign Application Priority Data

Jan. 26, 2021 (TW) .................................. 110102899
May 8, 2021 (TW) .................................. 110116665
May 8, 2021 (TW) .................................. 110205210

(51) Int. Cl.
*H01L 33/62* (2010.01)
*H01L 25/075* (2006.01)
*H01L 33/00* (2010.01)
*H01L 33/58* (2010.01)

(52) U.S. Cl.
CPC .......... *H01L 33/62* (2013.01); *H01L 25/0753* (2013.01); *H01L 33/005* (2013.01); *H01L 33/58* (2013.01); *H01L 2933/0066* (2013.01)

(58) Field of Classification Search
CPC . H01L 25/0753; H01L 33/62; H01L 2221/10; H01L 2933/0066
See application file for complete search history.

(56) References Cited

U.S. PATENT DOCUMENTS

| | | | | |
|---|---|---|---|---|
| 2010/0052089 A1* | 3/2010 | Golan | ................... | H01L 31/105 257/443 |
| 2014/0209955 A1* | 7/2014 | Kim | ........................ | H01L 33/62 257/99 |
| 2014/0262456 A1* | 9/2014 | Richardson | .......... | H05K 1/0289 174/255 |
| 2024/0153927 A1* | 5/2024 | Bower | ................. | H05K 1/0306 |

* cited by examiner

*Primary Examiner* — Moazzam Hossain
(74) *Attorney, Agent, or Firm* — Muncy, Geissler, Olds & Lowe, P.C.

(57) ABSTRACT

A light-emitting display device includes at least a transparent substrate, a first patterned conductive layer and a second patterned conductive layer respectively disposed on top of the opposite first and second surfaces of the transparent substrate, and a plurality of inorganic electroluminescent objects disposed in form of an array on top of the first surface of the transparent substrate with the inorganic electroluminescent objects being spaced from one another in a distance of at least 2 mm. Each of the inorganic electroluminescent objects has one power pin and light signal pins for red light, green light, and blue light. The transparent substrate has a plurality of through holes between the first surface and the second surface. The first patterned conductive layer has a plurality of soldering pad regions respectively in connection with the power pin and the light signal pins. At least one of the soldering regions is in electrical connection with the second patterned conductive layer by means of one of the through holes.

20 Claims, 11 Drawing Sheets

LIGHT-EMITTING DISPLAY DEVICE AND METHOD OF MANUFACTURING THE SAME

TECHNICAL FIELD

The present invention relates to a display device and especially to a light-emitting display device and method of manufacturing the same.

BACKGROUND

The technology development of light-emitting display having flexible substrate to dispose point-type light-emitting sources has become important in view of the request for larger, planar, thinner, lighter, and flexible display. In a branch of the technology development, the follow-up of large-screen light-emitting displays developed by using light-emitting diodes (LEDs) as passive light-emitting sources and for people to watch from a distance is worthy of attention.

Being different from organic light-emitting diode (OLED) displays and micro-size light-emitting diode (Micro-LED) displays for people to watch before one's eyes, these light-emitting displays for people to watch from a distance can be produced by installing a plurality of LED lamps each being composed of multiple LEDs on a transparent substrate in the form of an array with the distance between the LED lamps being not less than 2 mm. To light up each LED lamp in the array to the extent that the brightness of the LED lamps is well satisfied, the substrate and wirings for the installation of the LED lamps must have good electrical conductivity. In addition, it is required to reduce the visibility of the wirings and increase the aperture ratio in the display screen to improve the contrast of such light-emitting displays. On the other hand, it is desired that the design of the wirings has flexible changeability and can be quickly produced to perform display effects required in various applications. In view of the above technical problems, the present invention aiming to provide solutions.

SUMMARY

In view of the above issues, this application proposes a light-emitting display device and a method of manufacturing the light-emitting display device.

The light-emitting device at least has a first transparent substrate, a plurality of inorganic electroluminescent objects, a first patterned conductive layer, and a second patterned conductive layer. The first transparent substrate has a first surface, a second surface facing the opposite side of the first surface, and a plurality of through holes defined between the first surface and the second surface with the through holes having electrically conductive materials on their surface. The inorganic electroluminescent objects are disposed in form of an array on top of the first surface of the first transparent substrate with the inorganic electroluminescent objects being spaced from one another in a distance of at least 2 mm, wherein each of the inorganic electroluminescent objects has one power pin and three light signal pins respectively for red light, green light, and blue light. The first patterned conductive layer has a plurality of groups of soldering pad regions disposed on the first surface of the first transparent substrate. Each group of the soldering pad regions includes a first soldering pad region, a second soldering pad region, a third soldering pad region, and a fourth soldering pad region disposed next to but electrically isolated from one another to be correspondingly in electrical connection with the power pin and the light signal pins. Each group of the soldering pad regions further includes a plurality of pad-connecting portions spaced from one another and respectively connected to the first soldering pad region, the second soldering pad region, the third soldering pad region, and the fourth soldering pad region. The second patterned conductive layer is disposed on top of the second surface of the first transparent substrate and electrically connected to one of the pad-connecting portions by means of one of the through holes.

In a first embodiment, the first patterned conductive layer further has a group of grid wiring lines ranging from 10 to 100 um in linewidth and including parts respectively laying along a first direction and a second direction crossing with each other. Additionally, each group of the grid wiring lines is in connection with the pad-connecting portion of the first soldering pad region. The pad-connecting portions of the second soldering pad region, the third soldering pad region, and the fourth soldering pad region are spaced from the grid wiring lines and each is connected to one of the through holes. The second patterned conductive layer further has a plurality of first slender wiring lines laying along the first direction and having one end connecting to one of the through holes. The first slender wiring lines are partially overlapped with the parts of the grid wiring lines laying along the first direction.

In the first embodiment, the light-emitting display device further has a third patterned conductive layer having a plurality of second slender wiring lines laying along the second direction with one end connecting to one of the through holes, disposed on top of the second surface of the first transparent substrate; and a first patterned electrically insulative layer having a plurality of first electrically insulative segments to electrically insulate the second slender wiring lines from the first slender wiring lines, disposed between the second patterned conductive layer and the third patterned conductive layer; wherein the second slender wiring lines are partially overlapped with the parts of the grid wiring lines laying along the second direction.

In a second embodiment, the first patterned conductive layer further includes at least three spaced third slender wiring lines respectively in connection with the pad-connecting portions of the second soldering pad region, the third soldering pad region, and the fourth soldering pad region. The second patterned conductive layer includes a group of grid wiring lines of 10 um to 100 um in linewidth. The pad-connecting portion of the first soldering pad region is in electrical connection with a junction of the grid wiring lines of the second patterned conductive layer by means of one of the through holes.

In the second embodiment, the light-emitting display device further has a fourth patterned conductive layer and a second patterned electrically insulative layer. The fourth patterned conductive layer is disposed on top of the first surface of the first transparent substrate and electrically isolated from the first patterned conductive layer. The fourth patterned conductive layer has fourth slender wiring lines that are spaced from one another, that lay along a direction crossing with the laying direction of the third slender wiring lines, and that connect respectively to the third slender wiring lines at one end and to a plurality of light-emitting signal input terminals at the other end. The second patterned electrically insulative layer is disposed between the first patterned conductive layer and the fourth patterned conductive layer and has a plurality of electrically insulative segments to electrically insulate the fourth slender wiring lines from the third slender wiring lines.

In the second embodiment, the light-emitting display device further has a patterned conductive metallic seed layer having the same patterns as the patterns of the first patterned conductive layer or the second patterned conductive layer. The patterned conductive metallic seed layer is formed on top of the first surface or the second surface of the first transparent substrate for formation of the first patterned conductive layer or the second patterned conductive layer.

In the second embodiment, the grid wiring lines of the second patterned conductive layer are made of a material selected from a group consisting of electrically conductive powder mixed ink, indium tin oxide (ITO), fluorine-doped tin oxide (FTO), zinc oxide (ZnO), aluminum-doped zinc oxide (AZO), copper, silver, nickel, and electroless nickel immersion gold.

In a third embodiment, the light-emitting display device further has a transparent protective layer disposed one top of the first patterned conductive layer and the inorganic electroluminescent objects. The top surface of the transparent protective layer is higher than the light-emitting surfaces of the inorganic electroluminescent objects, the material of the transparent protective layer fills the spaces within the first patterned conductive layer to the extent that the first patterned conductive layer and the inorganic electroluminescent objects are entirely covered by the transparent protective layer, and the refractive index of the transparent protective layer is larger than or equal to the refractive index of the light-emitting surfaces of the inorganic electroluminescent objects.

In the third embodiment, the light-emitting display device further has a second transparent substrate disposed on top of the transparent protective layer and fitted to the top surface of the transparent protective layer, wherein the refractive index of the second transparent substrate is greater than or equal to the refractive index of the transparent protective layer.

In the third embodiment, the light-emitting display device further has at least one anti-reflective film disposed on the top surface of the second transparent substrate, wherein the refractive index of the anti-reflective film is less than or equal to the refractive index of the second transparent substrate and greater than or equal to the refractive index of the air.

In the abovementioned embodiments, the first transparent substrate is made of a material selected from a group consisting of glass, ceramic, aluminum nitride ceramics, polycarbonate, ethylene-tetrafluoroethylene (ETFE), polyethylene terephthalate (PET), polyethylene naphthalate (PEN), polyethylene glycol (PEG), polyimide (PI), polymethyl methacrylate (PMMA), bismaleimide triazine resin, glass fiber, and cyclic olefin copolymer.

On the other hand, the present invention proposes a method of manufacturing the light-emitting display device.

The method includes at least the following steps: providing a first transparent substrate having a plurality of through holes defined between a first surface and a second surface of the first transparent substrate, wherein the second surface faces the opposite side of the first surface; plating or filling the through holes with electrically conductive materials; forming a first patterned conductive layer on top of the first surface of the first transparent substrate with the first patterned conductive layer including a plurality of groups of soldering pad regions, wherein each group of the soldering pad regions includes a first soldering pad region, a second soldering pad region, a third soldering pad region, and a fourth soldering pad region disposed next to but electrically isolated from one another to be correspondingly in electrical connection with a power pin and a plurality of light signal pins of an inorganic electroluminescent object, and each group of the soldering pad regions further includes a plurality of pad-connecting portions spaced from one another and respectively connected to the first soldering pad region, the second soldering pad region, the third soldering pad region, and the fourth soldering pad region; forming a second patterned conductive layer on top of the second surface; and electrically connecting the second patterned conductive layer to one of the pad-connecting portions by means of one of the through holes.

In a first embodiment, the first patterned conductive layer is further formed with a group of grid wiring lines including parts respectively laying along a first direction and a second direction crossing with each other; the second patterned conductive layer is further formed with a plurality of first slender wiring lines laying along the first direction and having one end connecting to one of the through holes; and the first slender wiring lines are formed to be partially overlapped with the parts of the grid wiring lines laying along the first direction.

In the first embodiment, the method further includes the following steps: forming on top of the second patterned conductive layer with a first patterned electrically insulative layer having a plurality of first electrically insulative segments; and forming on top of the first patterned electrically insulative layer with a third patterned conductive layer having a plurality of second slender wiring lines laying along the second direction with one end connecting to one of the through holes; wherein the first electrically insulative segments electrically isolate the second slender wiring lines from the first slender wiring lines, and the second slender wiring lines are partially overlapped with the parts of the grid wiring lines laying along the second direction.

In the first embodiment, the third patterned conductive layer is formed in a process of screen printing or spray printing.

In the first embodiment, the pad-connecting portion of the first soldering pad region is in connection with the grid wiring lines of the first patterned conductive layer while the pad-connecting portions of the second soldering pad region, the third soldering pad region, and the fourth soldering pad region are separated from the grid wiring lines of the first patterned conductive layer and respectively in connection with one of the through holes.

In a second embodiment, the first patterned conductive layer is further formed with at least three spaced third slender wiring lines respectively in connection with the pad-connecting portions of the second soldering pad region, the third soldering pad region, and the fourth soldering pad region; the second patterned conductive layer is formed with a group of grid wiring lines; and the pad-connecting portion of the first soldering pad region is in electrical connection with a junction of the grid wiring lines of the second patterned conductive layer by means of one of the through holes.

In the second embodiment, the method further has the following steps: forming on top of the first patterned conductive layer with a second patterned electrically insulative layer having a plurality of second electrically insulative segments; and forming on top of the second patterned electrically insulative layer with a fourth patterned conductive layer having fourth slender wiring lines being spaced from one another, laying along a direction crossing with the laying direction of the third slender wiring lines, and connecting respectively to the third slender wiring lines at one end and connecting respectively to a plurality of light-emitting signal input terminals at the other end; wherein the second electrically insulative segments electrically isolate the third slender wiring lines from the fourth slender wiring lines.

In the second embodiments, the method further has the following steps: forming on top of the first surface or the second surface of the first transparent substrate with a patterned conductive metallic seed layer in a process of sputtering, screen printing, or spray printing; wherein the first patterned conductive layer or the second patterned conductive layer is formed on top of the patterned conductive metallic seed layer in a process of sputtering, etching, electroless plating, or electroplating, and one end of the through holes which is near the first surface of the transparent plate is plated with materials of the pad-connecting portion of the first soldering pad region.

In the abovementioned embodiments of the method, one of the first patterned conductive layer and the second patterned conductive layer is formed in a process of screen printing or spray printing.

In sum, the light-emitting display device and the method of making the same as described in each embodiment of the present invention have at least the following characteristics: Firstly, the connecting wires respectively connected with the soldering pad regions which are correspondingly in connection with the power pin and the light signal pins of the inorganic electroluminescent objects can be arranged in different layers not sharing the same plane. In this manner, the space for arranging the wires connecting the power pin can be enlarged, which in turn increases the electrical conductivity of the power connecting wires. Furthermore, in the enlarged space for wire arrangement, the power connecting wires can be divided into grid wiring lines with smaller linewidth, thereby increasing the aperture ratio of the display screen and in turn increasing the transparency. Secondly, the light signal connecting wires are overlapped with and electrically isolated from the power connecting wires to reduce the visibility of the light signal connecting wires. Third, the electrical insulative layers are employed to enable electrical isolation between the outgoing lines of the light signal connecting wires and the light signal connecting wires at different layers. In this manner, the outgoing lines of the light signal connecting wires can be arranged to be overlapped with the power connecting wires in the layout space, thereby reducing the visibility of the outgoing lines of the light signal connecting wires. Fourthly, a set of micro-size LED dies may be adopted as the inorganic electroluminescent objects to reduce their visibility in the display screen. Fifthly, the patterned conductive layers and the inorganic electroluminescent objects may be covered with the protective layer to avoid the external environment pollution and contact damage. The transparent protective layer may have a refractive index designed to increase the light emitted from the inorganic electroluminescent objects and reduce the light reflected by the screen substrate and therefore to avoid any person standing at the rear side of the first transparent substrate from seeing the reflected light. Additionally, a second transparent substrate may be attached onto the transparent protective layer, and one or more than one anti-reflection films may be adhered to the second transparent substrate to reduce the light reflection of the emitting light of the light-emitting display device and the ambient light at the interface of the second transparent substrate and the air, which similarly avoids the person standing at the rear side of the first transparent substrate from seeing the reflected light. Finally, the screen printing and spray printing processes may be used to form the patterned conductive layers which are in electrical connection with the inorganic electroluminescent objects. In this case, near-infrared light may also be used to quickly cure the printed or sprayed patterned conductive layers, thereby shortening the process time and facilitating the procedures. Since the visibility of all the connecting wires on the first transparent substrate in the display screen can be reduced and therefore the aperture-ratio can be increased, the contrast and clarity of viewing such light-emitting display device in a distance can be improved.

BRIEF DESCRIPTION OF DRAWINGS

The following detailed descriptions, given by listing examples which are not intended to limit the present invention solely thereto, will be best be understood in conjunction with the accompanying figures.

DETAILED DESCRIPTION OF THE EMBODIMENTS

Figure 1:
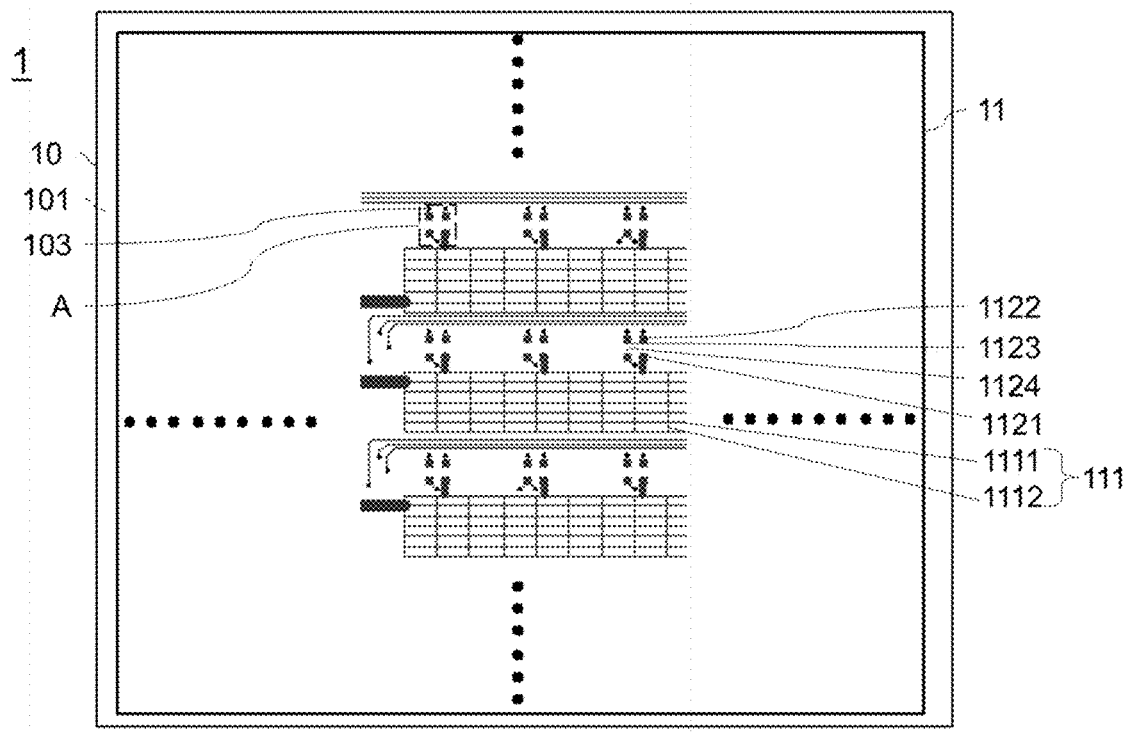
FIG. 1 is a schematic plan view illustrating a transparent substrate and a first patterned conductive layer of a light-emitting display device according to a first embodiment of the present invention.

This invention relates to a light-emitting display device and a method of making the same. It should be noted that basic knowledge well known in the art, such as principles of light-emitting diodes and a patterned conductive layer having certain conductive circuit patterns, will not be described herein in detail. If any technical term described herein has a different meaning from its common meaning in the art, such technical term should be explained as its description herein given. Drawings accompanied in the description are intended to schematically illustrate the relevant characteristics and are not plotted in scale. The wording "first," "second," "third" and "fourth" mentioned in the following text are used only for the purpose of distinguishing similar elements and are not sequential.

As shown in FIGS. 1-7, a light-emitting display device 1 according to a first embodiment of the present invention includes a transparent substrate 10, a plurality of inorganic electroluminescent objects 100 (see FIG. 6), a first patterned conductive layer 11 disposed on top of a first surface 101 of the transparent substrate 10, a second patterned conductive layer 12 disposed on top of a second surface 102 of the transparent substrate 10, a first patterned electrically insulative layer 13, and a third patterned conductive layer 14. The transparent substrate 10 has the first surface 101, the second surface 102 opposite to the first surface 101, and a plurality of through holes 103 defined between the first surface 101 and the second surface 102. Each of the though holes 103 is coated with conductive materials and therefore is electrically conductive. The transparent substrate 10 may be made of a material selected from a group consisting of glass, ceramic, aluminum nitride ceramics, polycarbonate, ethylene-tetrafluoroethylene (ETFE), polyethylene terephthalate (PET), polyethylene naphthalate (PEN), polyethylene glycol (PEG), polyimide (PI), polymethyl methacrylate (PMMA), bismaleimide triazine resin (BT), glass fiber, and cyclic olefin copolymer. Unlike the organic light-emitting diode (OLED) displays or the micro-size light-emitting diode (Micro-LED) displays, the inorganic electroluminescent objects 100 are disposed in form of an array on top of the first surface 101 of the transparent substrate 10 and are spaced from one another in a distance of 2 mm to 3 mm. Each of the inorganic electroluminescent objects 100 refers to a passive component without employing a drive IC chip and is a combination of several LED dies or lamps emitting red, green, and blue light. Moreover, each of the inorganic electroluminescent objects 100 has a power pin and a plurality of light signal pins for lighting of the red, green, and blue lights.

Figure 2:
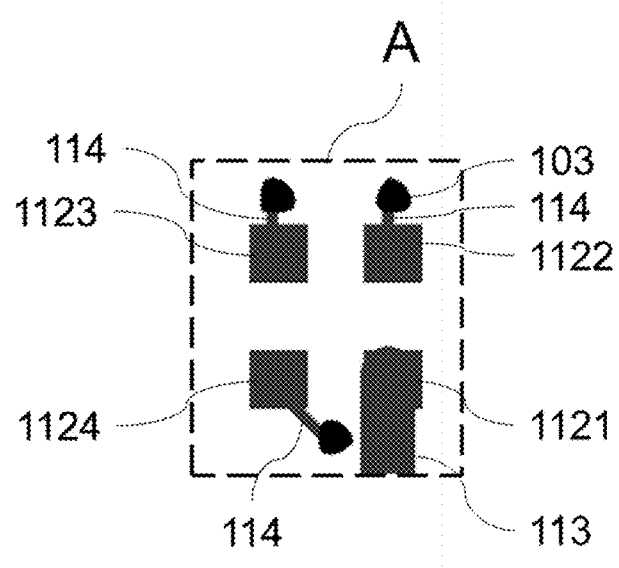
FIG. 2 is an enlarged schematic plan view illustrating the area A of FIG. 1.
Figure 6:
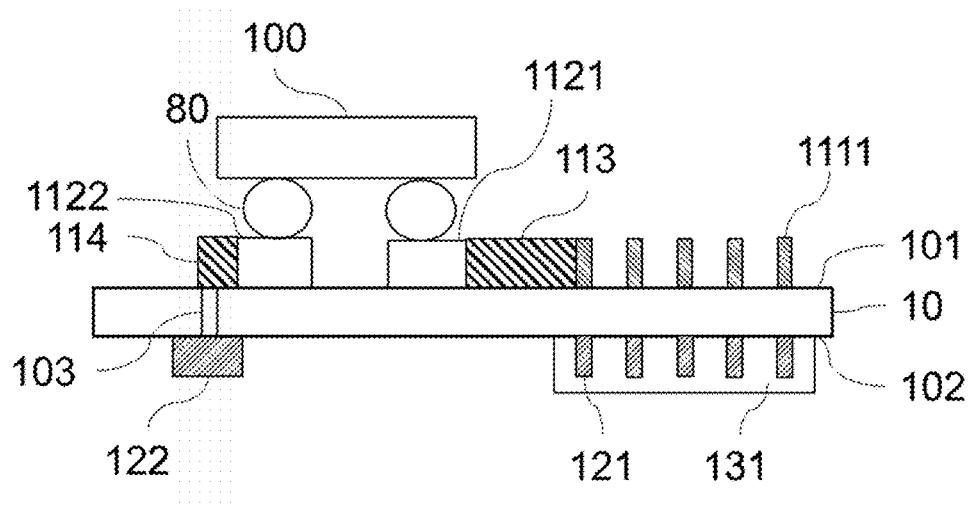
FIG. 6 is a schematic plane view illustrating the B-B cross section of the light-emitting display device of FIG. 5.

As shown in FIGS. 1 and 2, in the first embodiment, the first patterned conductive layer 11 has a plurality of groups 112 of soldering pad regions disposed on the first surface 101 of the transparent substrate 10. Each group 112 of the soldering pad regions includes a first soldering pad region 1121, a second soldering pad region 1122, a third soldering pad region 1123, and a fourth soldering pad region 1124 that are disposed next to but electrically isolated from one another. The first soldering pad region 1121 is correspondingly in electrical connection with the power pin of one of the inorganic electroluminescent objects 100 (see FIG. 6). The second, third and fourth soldering pad regions 1122, 1123, 1124 are correspondingly in electrical connection with the light signal pins of one of the inorganic electroluminescent objects 100. Since the first, second, third and fourth soldering pad regions 1121, 1122, 1123, 1124 are united as one group 112 of the soldering pad regions, the first patterned conductive layer 11 can be regarded as an array of the plurality of groups 112 of the soldering pad regions, and the inorganic electroluminescent objects 100 (see FIG. 6) are respectively secured to the plurality of groups 112 of the soldering pad regions so that the inorganic electroluminescent objects 100 are disposed in form of an array on top of the first surface 101 of the transparent substrate 10. In one embodiment, as shown in FIG. 6, each of the pins of each of the inorganic electroluminescent objects 100 correspondingly in electrical connection with the first, second, third and fourth soldering pad regions 1121~1124 is secured thereto by using an electrical connection material 80, such as solder paste. When each of the inorganic electroluminescent objects 100 includes only a single LED chip or die, the number of the corresponding soldering pad regions may be reduced to two, rather than four.

As shown in FIGS. 1 and 2, each group 112 of the soldering pad regions of the first patterned conductive layer 11 further includes a plurality of pad-connecting portions 113, 114 spaced from one another. The pad-connecting portions 113, 114 are respectively connected to the first, second, third, and fourth soldering pad regions 1121~1124. Preferably, one of the first, second, third, and fourth soldering pad regions 1121~1124 is adjacent to one of the through holes 103. In this embodiment, each of the second, third and fourth soldering pad regions 1122~1124 is adjacent to one of the through holes 103. In other embodiments, the distance between one of the soldering pad regions and its corresponding through hole may be increased to the extent that one of the soldering pad regions is not adjacent to its corresponding through hole. In any case, one of the pad-connecting portions 113, 114 is electrically connected to the second patterned conductive layer 12 by means of one of the through holes 103.

As shown in FIGS. 1 and 2, in this embodiment, the first patterned conductive layer 11 further has a group of grid wiring lines 111 including parts respectively laying along a first direction (as the horizontal direction in the plane of FIG.

1) and a second direction (as the vertical direction in the plane of FIG. 1) crossing with each other. Each group of the grid wiring lines 111 is in connection with the pad-connecting portion 113 of the first soldering pad regions 1121, for loading the input voltage and carrying the input current of the inorganic electroluminescent objects 100. As depicted in FIG. 1, the grid wiring lines 111 include a plurality of horizontal parts 1111 laying in the first direction and a plurality of vertical parts 1112 laying in the second direction. The grid wiring lines 111 range from 10 μm to 100 μm in linewidth for purpose of being less visible or difficult to be noticed. The grid wiring lines 111 are disposed on top of the first surface 101 of the transparent substrate 10 in a manner of being divided into spaced groups arranged along a specific direction (such as the vertical direction in the plane of FIG. 1). In one embodiment, the grid wiring lines 111 cover about 30% to 70% areas of the first surface 101 of the transparent substrate 10. The grid shape of the grid wiring lines 111 may be polygon, such as rectangle (as in FIG. 1), hexagon (not shown), or octagon (not shown), and is not limited to a particular shape herein. Besides, the pad-connecting portions 114 that are correspondingly in connection with the second, third, fourth soldering pad regions 1122, 1123, 1124 are spaced from the grid wiring lines 111, and each of the pad-connecting portions 114 has one end connected to one of the through holes 103.

As shown in FIGS. 1-2, in the first embodiment, the pad-connecting portion 113 of the first soldering pad region 1121 of the first patterned conductive layer 11 has the other end connected to the grid wiring lines 111. The pad-connecting portion 113 lays in a plane in parallel to the layout plane of the grid wiring lines 111 and along the arrangement direction of the grid wiring lines 111 (such as the vertical direction in the plane of FIGS. 1 and 2). In one embodiment, the pad-connecting portion 113 connects the junctions (or grid nodes) of the grid wiring lines 111. As shown in FIG. 1, the pad-connecting portion 113 lays along the direction in which the vertical line parts 1112 of the grid wiring lines 111 lay. On the other hand, as shown in FIG. 2, each of the pad-connecting portions 114 of the first patterned conductive layer 11 has one end connected with one of the second, third, fourth soldering pad regions 1122, 1123, 1124, and the other end connected with one of the through holes 103. Optionally, the linewidth of the pad-connecting portions 113, 114 is greater than that of the grid wiring lines 111, and the the linewidth of the pad-connecting portion 113 is greater than that of the pad-connecting portion 114.

Figure 3:
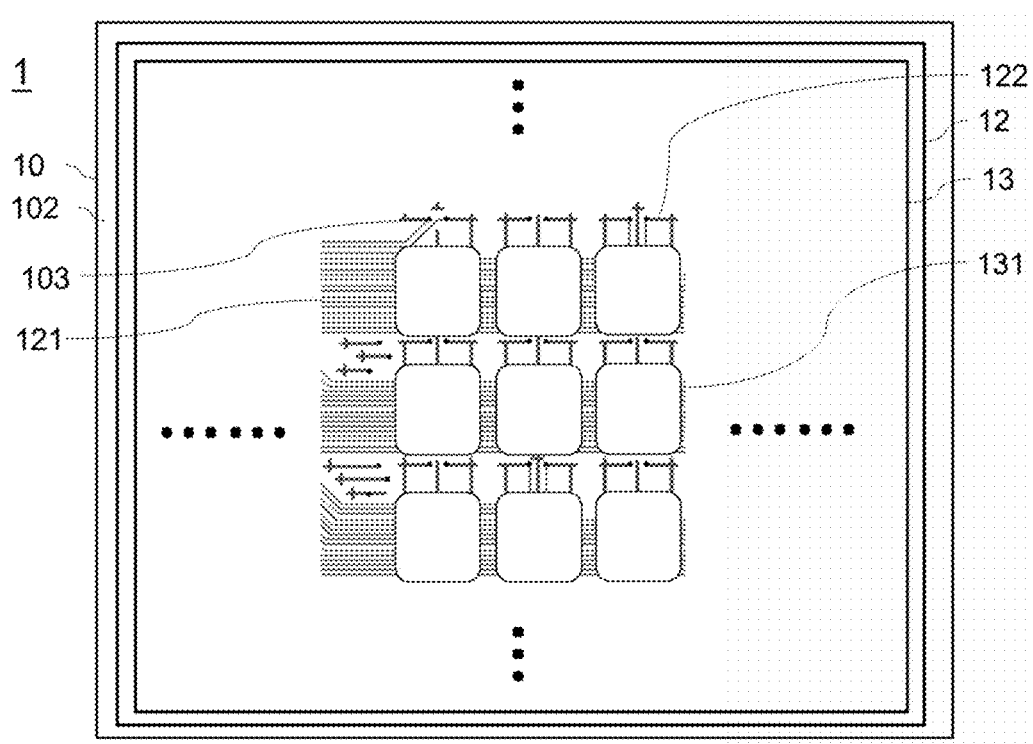
FIG. 3 is a schematic plan view illustrating the transparent substrate and a second patterned conductive layer and a first patterned electrically insulative layer of the light-emitting display device according to the first embodiment of the present invention.
Figure 5:
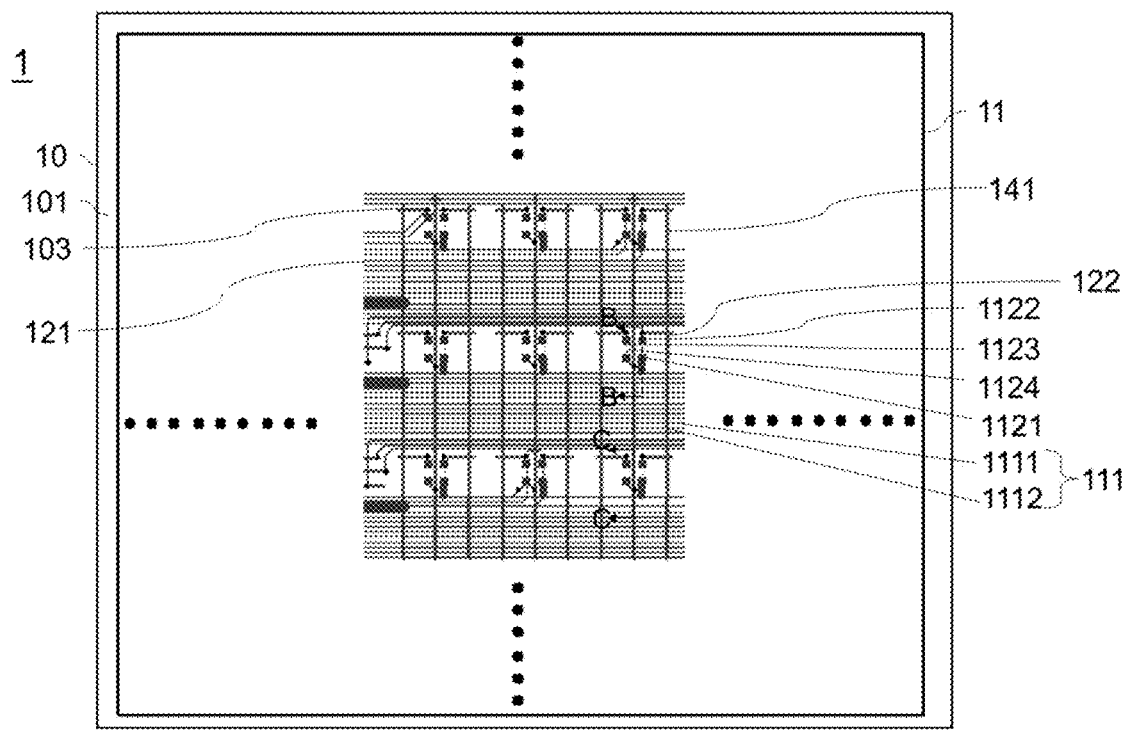
FIG. 5 is a schematic plan view simultaneously illustrating the transparent substrate, the first patterned conductive layer, the second patterned conductive layer, and the third patterned conductive layer of the light-emitting display device according to the first embodiment of the present invention, wherein the first patterned electrically insulative layer is not shown.

As shown in FIGS. 3 and 5, in the first embodiment, the second patterned conductive layer 12 is disposed on top of the second surface 102 of the transparent substrate 10 and has a plurality of first slender wiring lines 121 laying along the first direction (as the horizontal direction in the plane of FIG. 3). Each of the first slender wiring lines 121 has one end connected to one of the through holes 103 of the transparent substrate 10 and the other end connected to an input terminal (not shown) of the light signals of the light-emitting display device 1.

Figure 4:
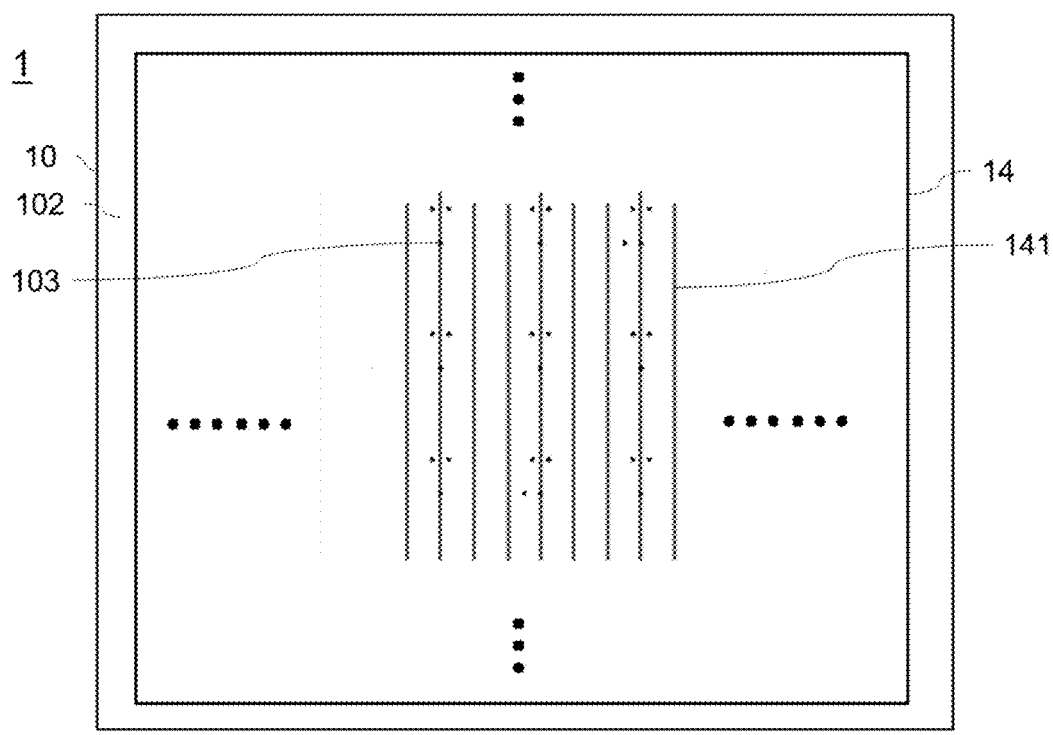
FIG. 4 is a schematic plan view illustrating the transparent substrate and a third patterned conductive layer of the light-emitting display device according to the first embodiment of the present invention, wherein the second patterned conductive layer and the first patterned electrically insulative layer are not shown.

As shown in FIGS. 4 and 5, in the first embodiment, the third patterned conductive layer 14 is disposed on top of the second surface 102 of the transparent substrate 10 and has a plurality of second slender wiring lines 141 laying in parallel with one another and along the second direction (as the vertical directions in the plane of FIG. 4). In one embodiment, one of the second slender wiring lines 141 (such as the middle one in FIG. 4) is connected to one of the through holes 103 of the transparent substrate 10. In one embodiment, the second slender wiring lines 141 has one end connected to an input terminal (not shown) of the light signals of the light-emitting display device 1 and the other end connected to one of the through holes 103 of the transparent substrate 10 by means of a hole connecting line 122, which lays in the first direction, of the second patterned conductive layer 12.

As shown in FIG. 3, the first patterned electrically insulative layer 13 has a plurality of first electrically insulative segments 131 disposed between the second patterned conductive layer 12 and the third patterned conductive layer 14. The first electrically insulative segments 131 are employed to electrically insulate the second slender wiring lines 141 from the first slender wiring lines 121. In one embodiment, any one of the first electrically insulative segments 131 of the first patterned electrically insulative layer 13 may be a stack of a plurality of electrically insulative layers put together in a manner of being stepped at both sides to increase flexibility.

As shown in FIG. 5, the first slender wiring lines 121 of the second patterned conductive layer 12 laying along the first direction are partially overlapped with the parts of the grid wiring lines 111 laying along the first direction. Alternatively, the second slender wiring lines 141 of the third patterned conductive layer 14 laying along the second direction are partially overlapped with the parts of the grid wiring lines 111 laying along the second direction. In this manner, visibility of the first slender wiring lines 121 laying along the first direction as well as the second slender wiring lines 141 laying along the second direction can be reduced, thereby enhancing the aperture ratio of the whole light-emitting display device 1.

Figure 7:
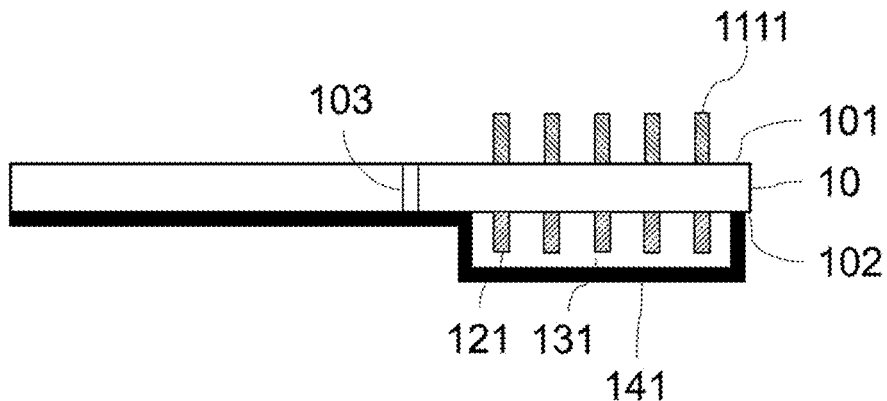
FIG. 7 is a schematic plane view illustrating the C-C cross section of the light-emitting display device of FIG. 5.

As shown in FIGS. 1, 2, 5, 6 and 7, in one embodiment, the first soldering pad region 1121 correspondingly in electrical connection with the power pin of each of the inorganic electroluminescent objects 100 is electrically connected to the grid wiring lines 111. Each of the second, third, fourth soldering pad regions 1122, 1123, 1124 correspondingly in electrical connection with the light signal pins of each of the inorganic electroluminescent objects 100 is electrically connected to one of the through holes 103 by means of one of the pad-connecting portions 114. As shown in FIGS. 3, 5 and 6, some of the soldering pad regions, such as the second and third soldering pad regions 1122, 1123, are respectively connected to one end of the first slender wiring lines 121 or to one end of the hole connecting lines 122 by means of the pad-connecting portions 114 and the through holes 103. As depicted in FIG. 5, the hole connecting lines 122 have the other ends connected to the second slender wiring lines 141 of the third patterned conductive layer 14. As shown in FIGS. 4, 5 and 7, some of the soldering pad regions, such as the fourth soldering pad region 1124, is electrically connected to the second slender wiring lines 141 of the third patterned conductive layer 14 by means of the pad-connecting portions 114 and the through holes 103. In other words, the grid wiring lines 111 and the pad-connecting portions 113 of the first patterned conductive layer 11 together serve as input voltage wires of the inorganic electroluminescent objects 100. The first slender wiring lines 121 of the second patterned conductive layer 12, some of the through holes 103, and some of the pad-connecting portions 114 of the first patterned conductive layer 11 together serve as wires of a first set input signals for the light signals of the inorganic electroluminescent objects 100. The second slender wiring lines 141 of the third patterned conductive layer 14, the hole connecting wires 122 of the second patterned conductive layer 12, some of the through holes 103, and some of the pad-connecting portions 114 of the first patterned conductive layer 11 together serve as wires of a second set input signals for the light signals of the inorganic electroluminescent objects 100. The first set input signals and the second set input signals may be two scanning signals transmitted along two different directions, such as horizontal and vertical directions.

Figure 8:
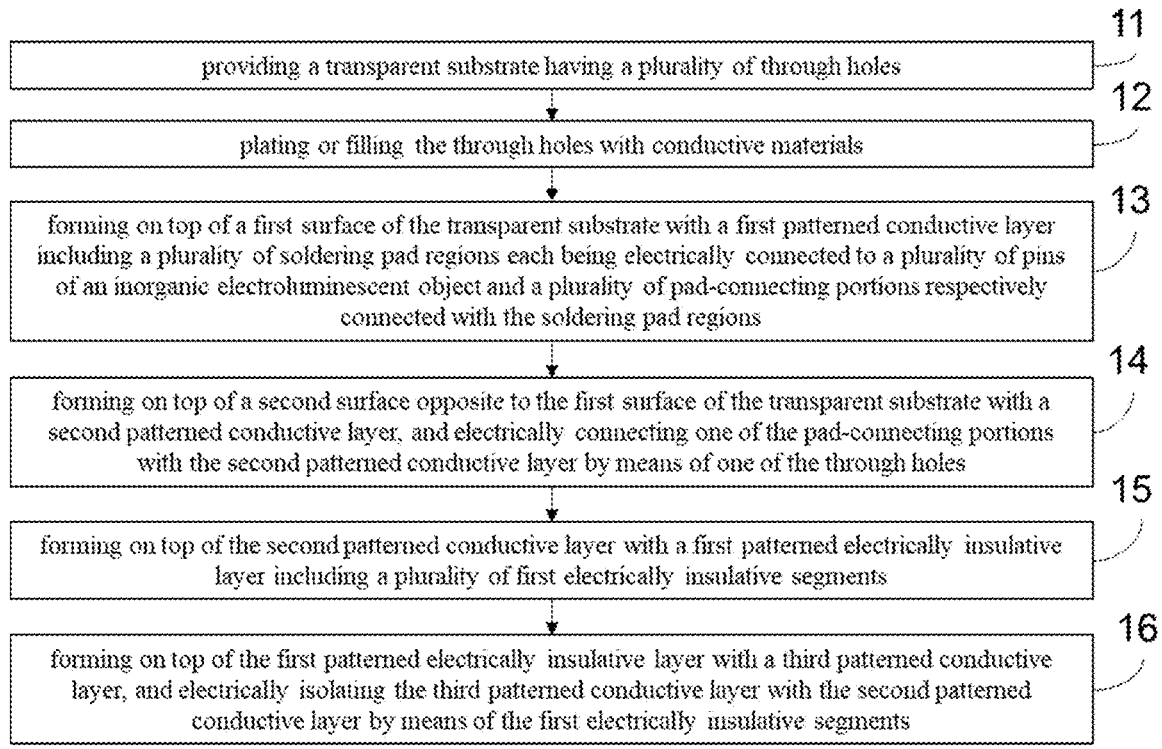
FIG. 8 is a flow chart illustrating a method of manufacturing the light-emitting display device according to a first embodiment of the present invention.

As shown in FIG. 8, a method of manufacturing the light-emitting display device according to a first embodiment of the present invention includes the following steps.

Step 11: providing a transparent substrate 10, as shown in FIG. 1, having a plurality of through holes 103 defined therein.

Step 12: plating or filling the through holes of the transparent substrate with electrically conductive materials. In one embodiment, sputtering or chemical plating (also known as electroless plating) is employed to deposit coatings of the electrically conductive materials in the through holes. In other embodiments, screen printing or spray printing is employed to fill the electrically conductive materials in the through holes.

Step 13: forming a first patterned conductive layer on top of the first surface of the transparent substrate. The first patterned conductive layer is formed with a plurality of groups of soldering pad regions, and a plurality of pad-connecting portions spaced from one another. Each group of the soldering pad regions includes a first soldering pad region, a second soldering pad region, a third soldering pad region, and a fourth soldering pad region disposed next to but electrically isolated from one another to be correspondingly in electrical connection with a power pin and a plurality of light signal pins of an inorganic electroluminescent object. The pad-connecting portions are respectively connected to the first soldering pad region, the second soldering pad region, the third soldering pad region, and the fourth soldering pad region. Optionally, the first patterned conductive layer is formed in a process of sputtering, etching, chemical plating, or electroplating. Alternatively, the first patterned conductive layer may be formed by using screen printing or spray printing. Preferably, the first patterned conductive layer is formed by using screen printing or spray printing. The elements that have been mentioned in FIGS. 1 and 2 are not described in detail herein. In one embodiment, the first patterned conductive layer is further formed with a group of grid wiring lines including two parts respectively laying along a first direction and a second direction crossing with each other. Each group of the grid wiring lines is electrically connected to one of the soldering pad regions. Optionally, the grid wiring lines are formed by using sputtering, etching, chemical plating or electroplating. Preferably, the grid wiring lines are formed by using screen printing or spray printing. Materials of the grid wiring lines and of the through holes may be the same or be different. Optionally, at least one of the grid nodes of the grid wiring lines is aligned with a though hole in the transparent substrate. In one embodiment, one of the pad-connecting portions is joined with the grid wiring lines and lays in a direction in parallel to the layout plane of the grid wiring lines. Other pad-connecting portions are spaced from the grid wiring lines and each connected to one of the through holes of the transparent substrate. The pad-connecting portions and the grid wiring lines may be made of the same material or of different material.

Step 14: forming a second patterned conductive layer on top of the second surface of the transparent substrate opposite to the first surface; and electrically connecting the second patterned conductive layer to one of the pad-connecting portions by means of one of the through holes. The elements that have been mentioned in FIG. 3 are not described in detail herein. Optionally, the second patterned conductive layer may be formed in a process of sputtering, etching, chemical plating, or electroplating, or be formed by using screen printing or spray printing. Preferably, the second patterned conductive layer is formed by using the screen printing or spray printing. In one embodiment, the second patterned conductive layer has a plurality of first slender wiring lines laying along the first direction. The first slender wiring lines are partially overlapped with the parts of the grid wiring lines laying along the first direction. The first slender wiring lines may be in parallel with one another.

Step 15: forming on top of the second patterned conductive layer a first patterned electrically insulative layer having a plurality of first electrically insulative segments. As illustrated in FIG. 3, the second patterned conductive layer has been mentioned and will not be described further. Optionally, the first patterned electrically insulative layer is formed by using screen printing or spray printing.

Step 16: forming on top of the first patterned electrically insulative layer a third patterned conductive layer; and electrically isolating the second patterned conductive layer from the third patterned conductive layer by the first electrically insulative segments. In one embodiment, the third patterned conductive layer has a plurality of second slender wiring lines laying along the second direction with one end connecting to one of the through holes. The first electrically insulative segments electrically isolate the second slender wiring lines from the first slender wiring lines. Moreover, the second slender wiring lines are partially overlapped with the parts of the grid wiring lines laying along the second direction. As illustrated in FIG. 5, the first patterned electrically insulative layer has been mentioned and will not be described further. The second slender wiring lines may be parallel to one another. Optionally, the third patterned conductive layer may be formed in a process of sputtering, etching, chemical plating, or electroplating, or be formed by using screen printing or spray printing. Preferably, the third patterned conductive layer is formed by using the screen printing or spray printing.

Referring to FIGS. 9A to 10D, a light-emitting display device 1a in accordance with a second embodiment of the present invention includes a transparent substrate 10, a plurality of inorganic electroluminescent objects 100 (see FIG. 10B), a first patterned conductive layer 11a, a second patterned conductive layer 12a, a second patterned electrically insulative layer 13a, and a fourth patterned conductive layer 14a. The first patterned conductive layer 11a, the second patterned electrically insulative layer 13a, and the fourth patterned conductive layer 14a are disposed in sequence on top of a first surface 101 of the transparent substrate 10 while the second patterned conductive layer 12a is disposed on top of a second surface 102 of the transparent substrate 10. The first patterned conductive layer 11a has a plurality of groups of soldering pad regions with each group including a first soldering pad region 1121a, a second soldering pad region 1122a, a third soldering pad region 1123a, and a fourth soldering pad region 1124a disposed next to but electrically isolated from one another. The repetitious details in this embodiment that are similar to the first embodiment are not described in detail herein.

Figure 9A:
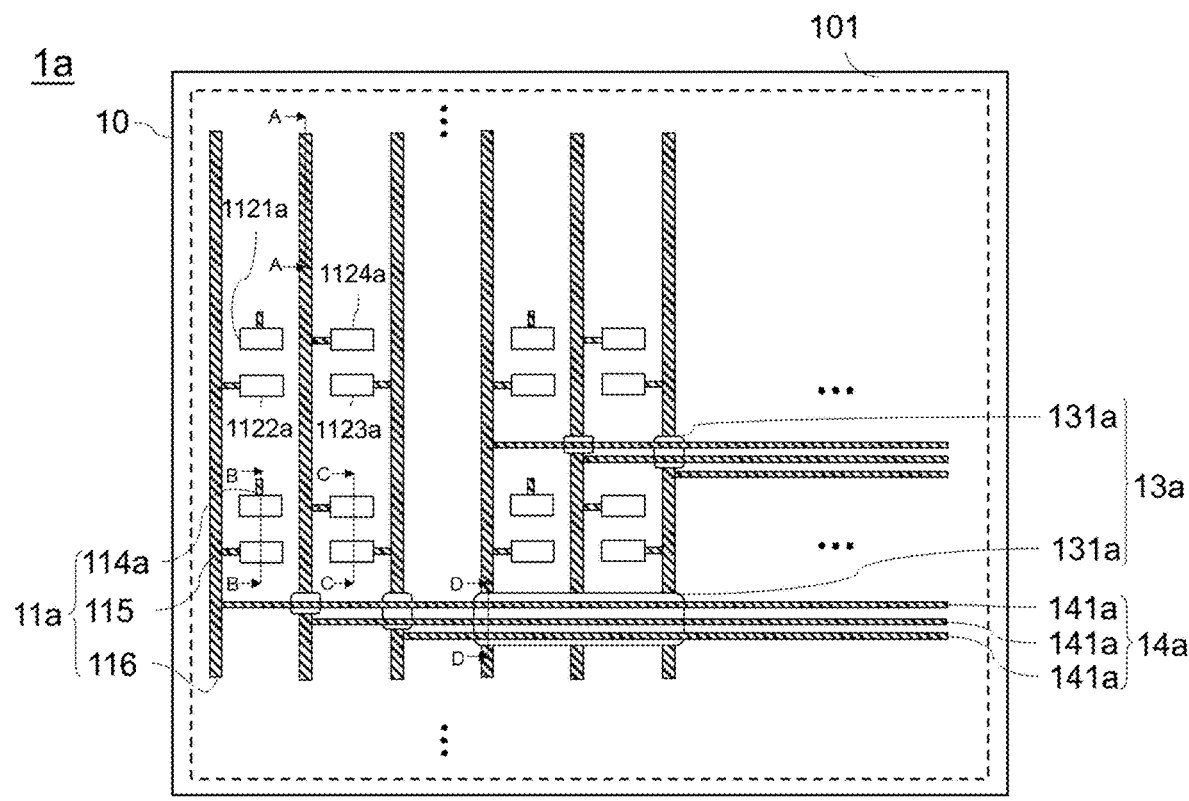
FIG. 9A is a schematic plan view illustrating a first patterned conductive layer and its wiring lines of a light-emitting display device according to a second embodiment of the present invention.
Figure 9B:
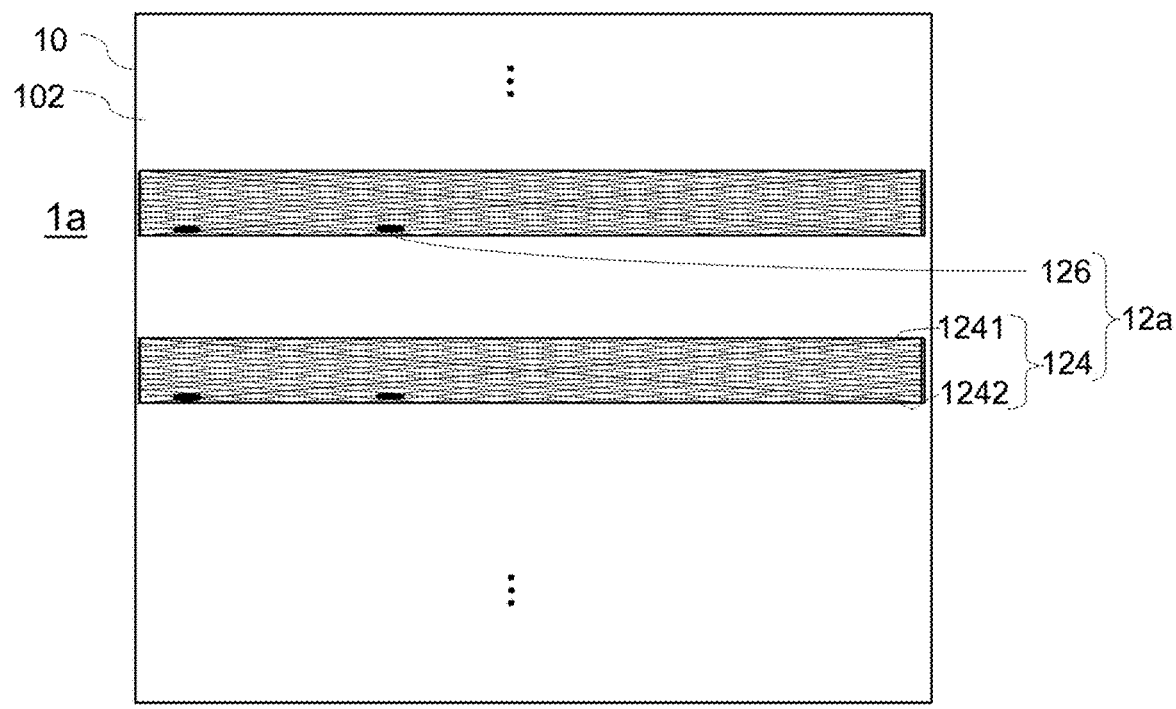
FIG. 9B is a schematic plan view illustrating a second patterned conductive layer and its wiring lines of the light-emitting display device according to the second embodiment of the present invention.
Figure 10A:
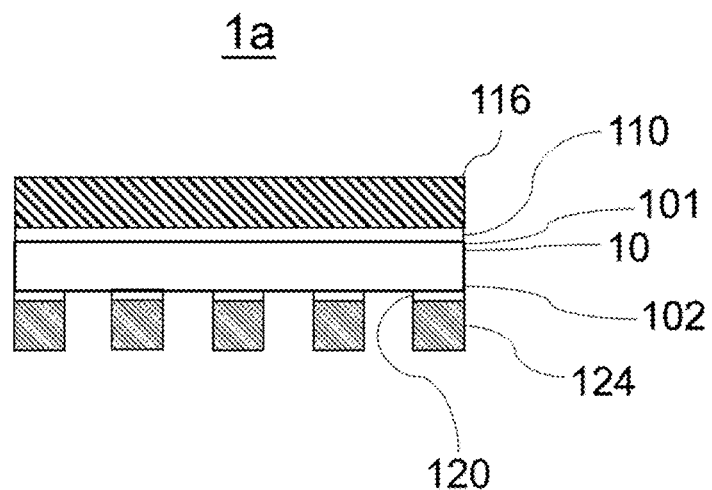
FIG. 10A is a schematic plan view illustrating the A-A cross section of the light-emitting display device of FIG. 9A manufactured in one process.
Figure 10B:
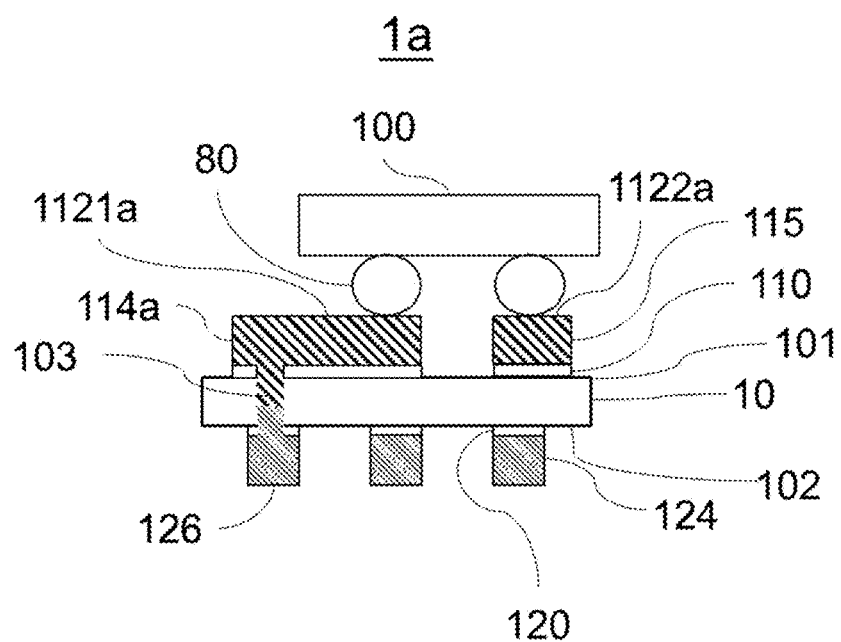
FIG. 10B is a schematic plan view illustrating the B-B cross section of the light-emitting display device of FIG. 9A manufactured in one process.

As shown in FIGS. 9A and 9B, in the second embodiment, the through holes 103 of the transparent substrate 10 are provided for electrical connection between the first patterned conductive layer 11a and the second patterned conductive layer 12a. As shown in FIG. 10B, only the first soldering pad region 1121a which is correspondingly in electrical connection with the power pin of the inorganic electroluminescent objects 100 is adjacent to one of the through holes 103.

Figure 10C:
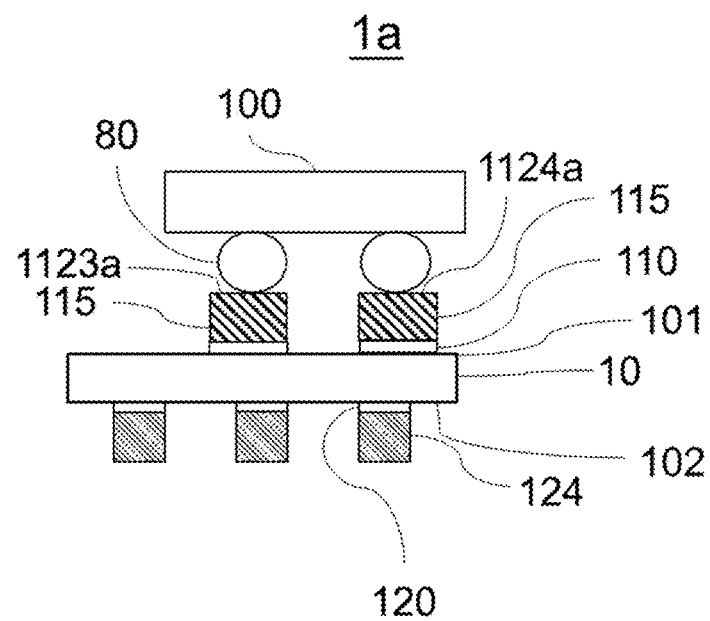
FIG. 10C is a schematic plan view illustrating the C-C cross section of the light-emitting display device of FIG. 9A manufactured in one process.

As shown in FIG. 9A and FIGS. 10A~10D, the first patterned conductive layer 11a further includes a plurality of pad-connecting portions 114a and 115 spaced from one another and respectively connected to the first soldering pad region 1121a, the second soldering pad region 1122a, the third soldering pad region 1123a, and the fourth soldering pad region 1124a. Each of the pad-connecting portions 114a, which is connected to the first soldering pad region 1121a, is electrically connected to the second patterned conductive layer 12a by means of one of the through holes 103 of the transparent substrate 10. Moreover, the first patterned conductive layer 11a further includes at least three spaced third slender wiring lines 116. The third slender wiring lines 116 are in parallel with one another and are respectively in connection with the pad-connecting portions 115 but are spaced apart from the pad-connecting portion 114a. As shown in FIGS. 10B and 10C, the first soldering pad region 1121a is disposed on the pad-connecting portion 114a while the second, third, fourth soldering pad regions 1122a, 1123a, 1124a are respectively disposed on the pad-connecting portions 115.

As shown in FIG. 9B and FIGS. 10A~10D, the second patterned conductive layer 12a is disposed on top of the second surface 102 of the transparent substrate 10 and has a plurality of grid wiring lines 124 having two parts respectively laying along a first direction and a second direction crossing with each other for loading the input voltage and carrying the current to the inorganic electroluminescent objects 110. The grid wiring lines 124 are divided into groups laying along a specific direction (such as the vertical directions in the plane of FIG. 9B) and on top of the second surface 102 of the transparent substrate 10. The grid shape, linewidth, and advantages of the grid wiring lines 124 have been mentioned in the above and are not described in further detail herein.

Figure 10D:
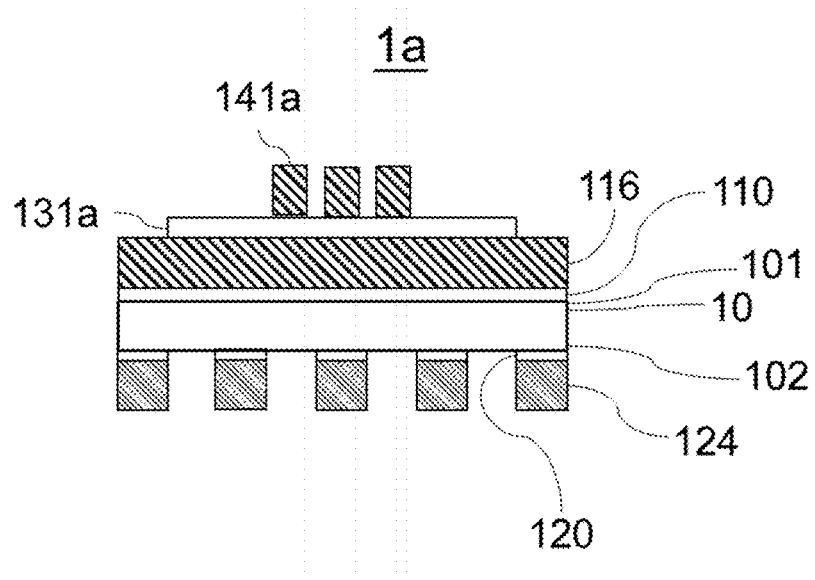
FIG. 10D is a schematic plan view illustrating the D-D cross section of the light-emitting display device of FIG. 9A manufactured in one process.

As shown in FIG. 9A and FIG. 10D, in the second embodiment, the second patterned electrically insulative layer 13a is formed on top of the first patterned conductive layer 11a and has a plurality of second electrically insulative segments 131a. The fourth patterned conductive layer 14a is formed on top of the second patterned electrically insulative layer 13a and has a plurality of fourth slender wiring lines 141a in parallel with one another. The fourth slender wiring lines 141a are spaced from one another and lay along a direction crossing with the laying direction of the third slender wiring lines 116 of the first patterned conductive layer 11a. For example, the fourth slender wiring lines 141a and the third slender wiring lines 116 may be orthogonal. Moreover, the fourth slender wiring lines 141a are respectively connected at one end to the third slender wiring lines 116, and the fourth slender wiring lines 141a are respectively connected at the other end to a plurality of input terminals of light signals of the light-emitting display device. The fourth patterned conductive layer 14a and the third slender wiring lines 116 of the first patterned conductive layer 11a are electrically isolated by the second patterned electrically insulative layer 13a. In this manner, the fourth slender wiring lines 141a are partially located on the second electrically insulative segments 131a of the second patterned electrically insulative layer 13a and are electrically isolated and separated from the third slender wiring lines 116. Therefore, the fourth slender wiring lines 141a and the third slender wiring lines 116 are arranged in different layers, which therefore increases the space arrangement for the third slender wiring lines 116 in the first patterned conductive layer 11a. Furthermore, since the fourth slender wiring lines 141a and the grid wiring lines 124 are overlapped in the same projection plane, the visibility of viewing the fourth slender wiring lines 141a in a display screen of the light-emitting display device from a distance can be reduced.

Moreover, as shown in FIG. 9A, the pad-connecting portions 115 may lay in a direction crossing with the laying direction of the third slender wiring lines 116. For example, the pad-connecting portions 115 lay in a direction orthogonal to the laying direction of the third slender wiring lines 116. Meanwhile, the pad-connecting portions 115 may lay in a direction parallel to the laying direction of the fourth slender wiring lines 141a. The pad-connecting portions 114a and the third slender wiring lines 116 may be formed in the same process or in separate processes. As shown in FIGS. 9B and 10B, the grid wiring lines 124 of the second patterned conductive layer 12a includes first line parts 1241 and second line parts 1242 laying in crossing directions. Each of the pad-connecting portions 114a is electrically connected to a junction 126 of the first line parts 1241 and the second line parts 1242 of the grid wiring lines 124 by means of one of the though holes 103 of the transparent substrate 10. The junction 126 is a grid node of the grid wiring lines 124. The third slender wiring lines 116 are arranged in a direction different from the direction in which the grid wiring lines 124 are arranged. Optionally, the third slender wiring lines 116 and the pad-connecting portions 115 may or may not have the same linewidth as that of the grid wiring lines 124, for example, in a range from 10 μm to 100 μm.

Referring to FIGS. 10A~10D, a first patterned conductive metallic seed layer 110 may be disposed on top of the first surface 101 of the transparent substrate 10 according to a modification of the second embodiment. The first patterned conductive metallic seed layer 110 has the same patterns as that of the third slender wiring lines 116 and the pad-connecting portions 115, 114a of the first patterned conductive layer 11a, and serves as a buffer layer for the formation of the first patterned conductive layer 11a. In this manner, the third slender wiring lines 116 and the pad-connecting portions 115, 114a are to be formed on the first patterned conductive metallic seed layer 110. Similarly, a second patterned conductive metallic seed layer 120 may be disposed on top of the second surface 102 of the transparent substrate 10. The second patterned conductive metallic seed layer 120 has the same patterns as that of the grid wiring lines 124 of the second patterned conductive layer 12a and serves as a buffer layer for the formation of the second patterned conductive layer 12a. In this manner, the grid wiring lines 124 are to be formed on the second patterned conductive metallic seed layer 120.

Referring to FIGS. 9A, 9B and 11A-11D, in another process of making the light-emitting display device 1b, the first surface 101 of the transparent substrate 10 is not disposed with the first patterned conductive metallic seed layer 100, while only the second surface 102 of the transparent substrate 10 is disposed with the second patterned conductive metallic seed layer 120. The detail description of the other parts which have been mentioned are herein omitted.

Figure 11A:
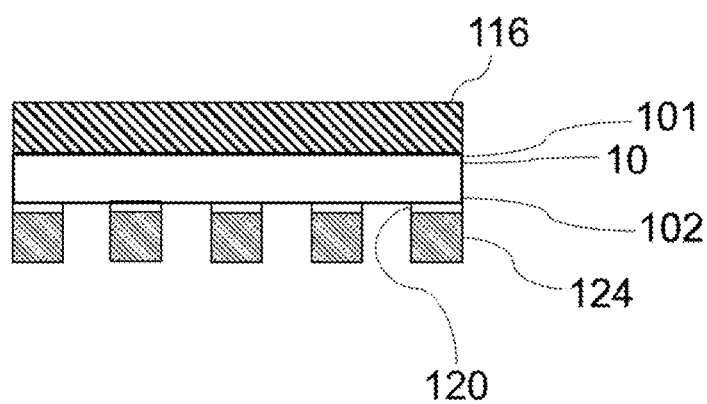
FIG. 11A is a schematic plan view illustrating the A-A cross section of the light-emitting display device of FIG. 9A manufactured in another process.
Figure 11B:
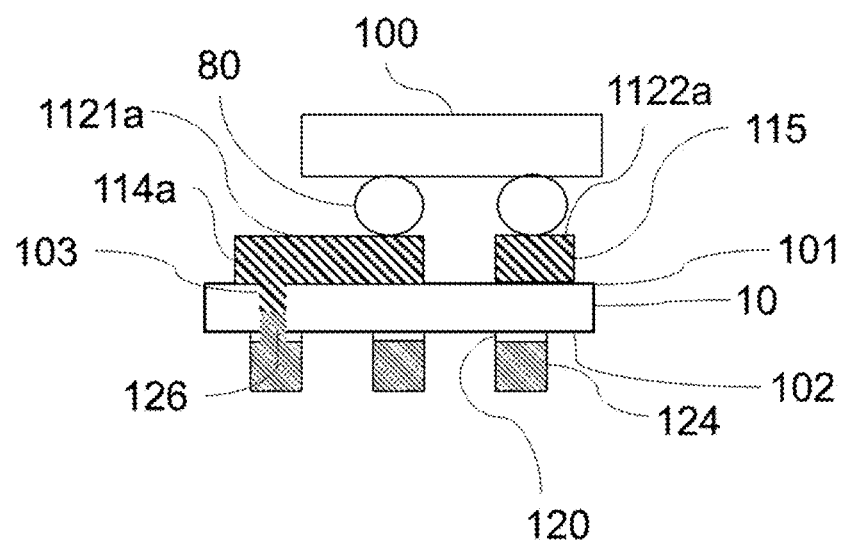
FIG. 11B is a schematic plan view illustrating the B-B cross section of the light-emitting display device of FIG. 9A manufactured in another process.
Figure 11C:
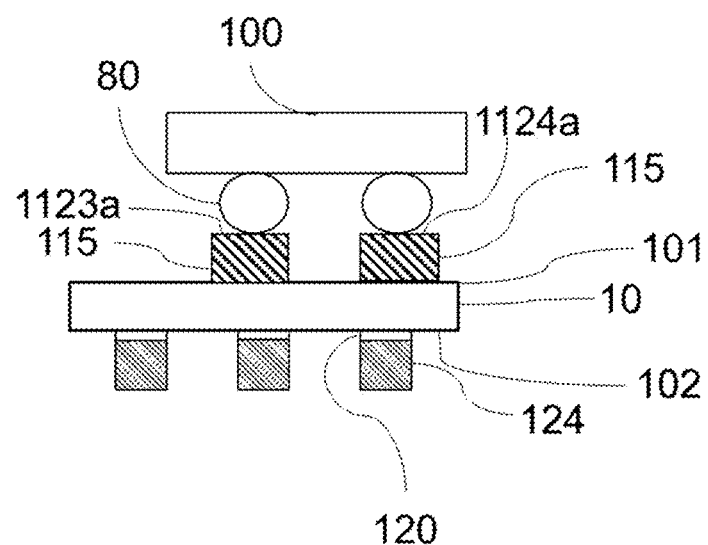
FIG. 11C is a schematic plan view illustrating the C-C cross section of the light-emitting display device of FIG. 9A manufactured in another process.
Figure 11D:
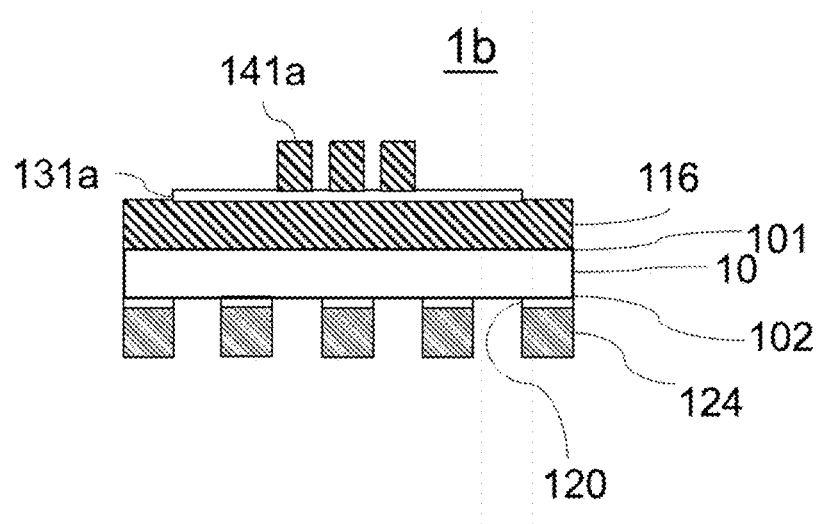
FIG. 11D is a schematic plan view illustrating the D-D cross section of the light-emitting display device of FIG. 9A manufactured in another process.
Figure 11E:
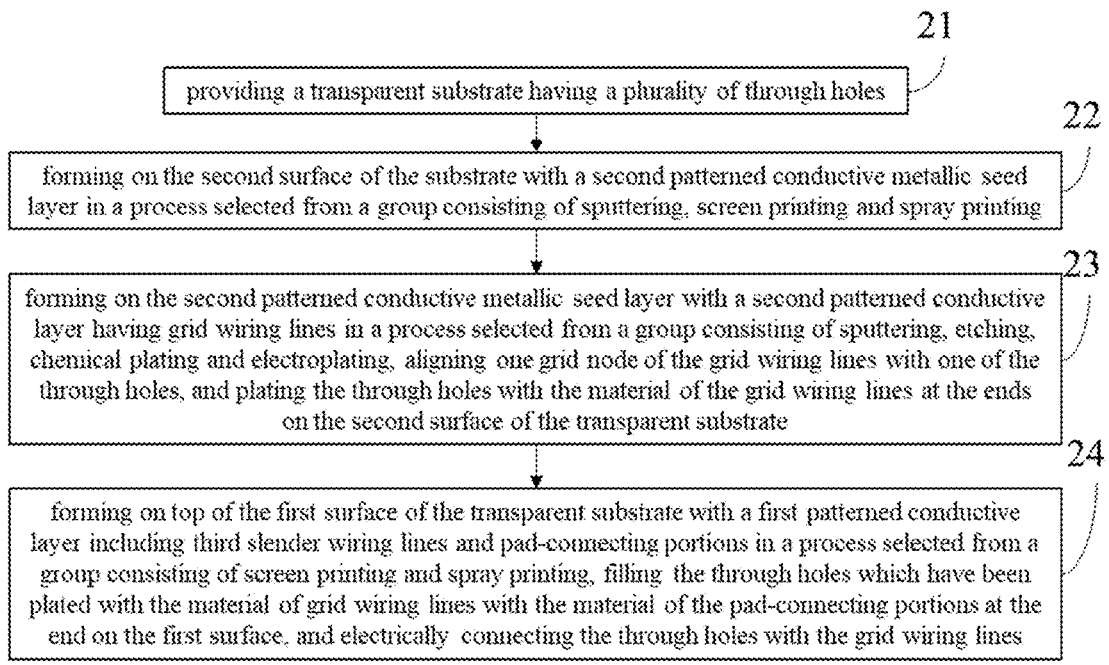
FIG. 11E is a flow chart illustrating a method of manufacturing the light-emitting display device of FIGS. 9A and 9B in another process.

FIG. 11E illustrates a method of making the light-emitting display device of FIGS. 9A and 9B without having the first patterned conductive metallic seed layer. The method includes the following steps.

Step 21: providing a transparent substrate 10 with a plurality of through holes 103 defined therein, as shown in FIG. 11B.

Step 22: forming a second patterned conductive metallic seed layer 120 on top of the second surface 102 of the transparent substrate 10, as shown in FIGS. 11A-11D, in a process of sputtering, screen printing, or spray printing.

Step 23: forming a second patterned conductive layer 12a having a plurality of grid wiring lines 124 on the second patterned conductive metallic seed layer 120 in a process of sputtering, etching, chemical plating or electroplating; having the junctions/grid nodes 126 of the grid wiring lines 124 respectively one-on-one aligned with the through holes 103; and plating the through holes 103 with materials of the grid wiring lines 124 at the ends on the second surface 102 of the transparent plate 10, as shown in FIGS. 9A, 9B and 11A~11D. The second patterned conductive layer 12a and the second patterned conductive metallic seed layer 120 have the same patterns. With the formation of the second patterned conductive metallic seed layer 120, the second patterned conductive layer 12a can be securely formed on the transparent substrate 10.

Step 24: forming a first patterned conductive layer 11a having the third slender wiring lines 116 and the pad-connecting portions 114a, 115 on top of the first surface 101 of the transparent substrate 10 in a process of screen printing or spray printing; and plating the plated through holes 103 with materials of the pad-connecting portions 114a at the other ends on the first surface 101 of the transparent plate 10 such that the through holes 103 are in electrical connection with the grid wiring lines 124 and the pad-connecting portions, as shown in FIGS. 9A, 9B and 11A~11C.

Figure 12:
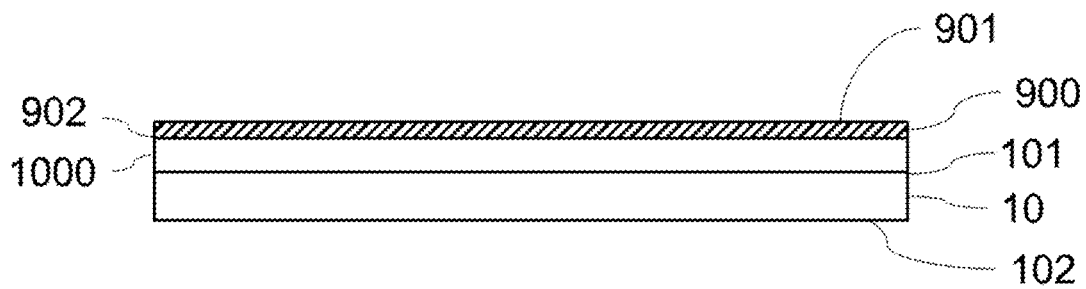
FIG. 12 is a schematic plan view illustrating a stacked structure of a light-emitting display device according to a third embodiment of the present invention.
Figure 13:
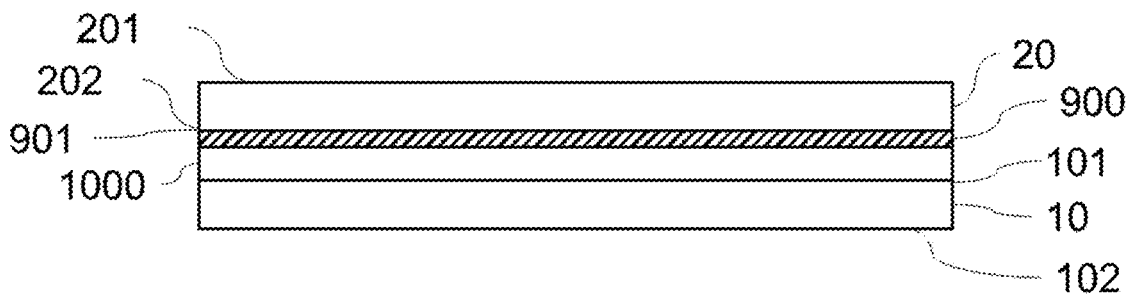
FIG. 13 is a schematic plan view illustrating a stacked structure of a light-emitting display device according to a fourth embodiment of the present invention.

As shown in FIGS. 12 and 13, in the third and fourth embodiments, it may be considered that a wiring layer 1000 is disposed on top of the transparent substrate 10 of the light-emitting display device and a protective layer 900 and a second transparent substrate 20 may be further disposed on top of the wiring layer 1000. The second transparent substrate 20 is disposed on top of the protective layer 900 and joined onto the top surface 901 of the protective layer 900. That is, the wiring layer 1000 and the protective layer 900 are sandwiched between the two transparent substrates 10, 20. The second transparent substrate 20 may be flexible or inflexible in form of a plate, a sheet, or a film. The two transparent substrates 10, 20 may be made of the same materials. To enhance the transparency of the whole light-emitting display device, the protective layer 900 is preferably a transparent body, such as silicone. It should be noted that silicon is a material which is originally liquid at room temperature and is turned into a transparent solid under high temperature baking; and the refractive index of the silicone may vary with a different material formulation. The wiring layer 1000 is a combined layer including at least the first patterned conductive layer 11 and the inorganic electroluminescent objects 100 in the first embodiment. Alternatively, the wiring layer 1000 may be a combined layer including the first patterned conductive layer 11a, the second patterned electrically insulative layer 13a, the fourth patterned conductive layer 14a, and the inorganic electroluminescent objects 100 in the second embodiment. As shown in FIG. 12, the protective layer 900 as a whole completely covers the wiring layer 1000. Any gaps between the patterned conductive layers or the electrically insulative layers of the wiring layer 1000 are filled with materials of the protective layer 900. The top surface of the protective layer 900 is higher than that of the wiring layer 1000 so as to separate the wiring layer 1000 from the air. In such manner, the inorganic electroluminescent objects 100 can be protected from contacting with the outside environment. Specifically, the back side of the inorganic electroluminescent objects 100 faces the first surface 101 of the transparent substrate 10 while the light-emitting surfaces of the inorganic electroluminescent objects 100 faces the bottom surface 902 of the protective layer 900. Since any gaps between the light-emitting surfaces of the inorganic electroluminescent objects 100 and the bottom surface 902 of the protective layer 900 are filled with the materials of the protective layer 900, the light emitted by the inorganic electroluminescent objects 100 will sequentially pass through the light-emitting surfaces of the inorganic electroluminescent objects 100 and the protective layer 900. In order to reduce total internal reflection of light emitted by the inorganic electroluminescent objects 100 in the interface of the light-emitting surface of the inorganic electroluminescent objects 100, which may be regarded as the top surface of the wiring layer 1000, and the bottom surface 902 of the protective layer 900, it is preferable that the direction of the emitting light of the inorganic electroluminescent objects 100 is orthogonal to the bottom surface 902 of the protective layer 900 and that the protective layer 900 has a refractive index greater than or equal to that of the light-emitting surface of the inorganic electroluminescent objects 100. For example, if the refractive index of the light-emitting surfaces of the inorganic electroluminescent objects 100 is 1.4, the refractive index of the protective layer 900 is preferably greater than or equal to 1.4. As shown in FIG. 13, when a second transparent substrate 20 is disposed on top of the protective layer 900, the refractive index of the protective layer 900 is preferably smaller than that of the second transparent substrate 20 in order to reduce the total internal reflection occurred in the interface of the top surface 901 of the protective layer 900 and the bottom surface 202 of the second transparent substrate 20. For example, if the second transparent substrate 20 is a glass, the refractive index of the protective layer 900 is preferably smaller than or equal to 1.55. Thus, the refractive index of the protective layer 900 is preferably between 1.4 and 1.55. For example, when the second transparent substrate 20 is a release film, the refractive index of the protective layer 900 is preferably smaller than or equal to that of the release film. In this way, the light generated by the inorganic electroluminescent objects 100 can arrive the second transparent substrate 20 with an increased quantity while reducing the amount of the light reflected at the transparent substrate 20, which in turn avoids one who stands at the rear side of the transparent substrate 20 of the light-emitting display device seeing the reflected light.

Figure 14:
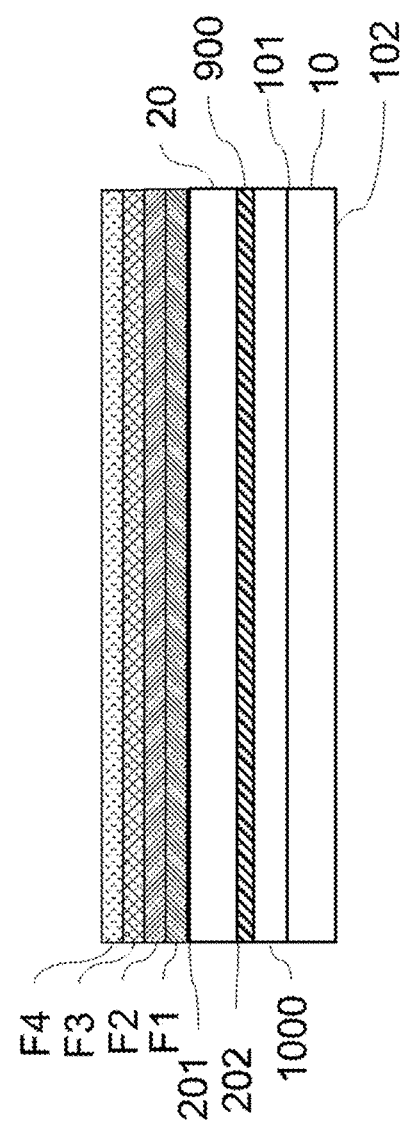
FIG. 14 is a schematic plan view illustrating a stacked structure of a light-emitting display device according to a fifth embodiment of the present invention.

As shown in FIG. 14, in the fifth embodiment, the top surface of the second transparent substrate 20 may be further disposed with at least one anti-reflective film (the size in the figure is not actual size). In case that more than two anti-reflective films such as four anti-reflective films F1, F2, F3 and F4 in the FIG. 14 are disposed, the lowest anti-reflective film F1 is adhered to the top surface 201 of the transparent substrate 20. The refractive indexes of the anti-reflective films may be different but are greater than the refractive index of air and smaller than the refractive index of the second transparent substrate 20. Preferably, the refractive indexes of the anti-reflective films decrease gradually from bottom to top and finally close to the refractive index of the air. For example, when the second transparent substrate 20 has a refractive index of 1.55, the refractive indexes of the anti-reflective films F1, F2, F3 and F4 may be 1.4, 1.3, 1.2 and 1.1, respectively. Preferably, the lowest anti-reflective film has the same or similar refractive index as that of the second transparent substrate, while the topmost anti-reflective film has the same or similar refractive index as that of the air. Additionally, the refractive indexes of the anti-reflective films are selected to decrease or increase gradually, for example, from 1.4, 1.3, 1.2 to 1.1, or from 1.1, 1.2, 1.3 to 1.4. In this way, reflection of any light, including emitting light of the inorganic electroluminescent objects 100 and the environment light, in the interface of the second transparent substrate 20 and the air can be reduced. According to an optical simulation experiment, it is found that when the transparent substrates 10, 20 have the same refractive indexes of 1.5 and the protective layer 900 has an refractive index of 1.45, the reflectivity at the interface of the second transparent substrate 20 and the air is 8.2; however, with the same condition, when the four anti-reflective films F1, F2, F3 and F4 with the refractive indexes of 1.4, 1.3, 1.2 and 1.1 are arranged on top of the second transparent substrate 20, the reflectivity at the interface of the transparent substrate 20 and the air is reduced to 4.4, which results in a degree of decrease of more than 45%. In case that only a single anti-reflective film is disposed on top of the second transparent substrate 20, the single anti-reflective film preferably has a refractive index between that of the second transparent substrate 20 and the air. According to another optical simulation experiment, when the transparent substrates 10, 20 have the same refractive indexes of 1.5, the protective layer 900 has a refractive index of 1.45, and the single anti-reflective film has a refractive index of 1.2, the reflectivity at the interface of the second transparent substrate 20 and the air is 6, which results in a degree of decrease of more than 25%. When only the single anti-reflective film is disposed on top of the second transparent substrate 20, the refractive index of the single anti-reflective film is preferably about the square root of the refractive index of the second transparent substrate 20. Additionally, the thickness of each of the aforementioned anti-reflective films is preferably a multiple of a quarter-wavelength of the light emitted from the inorganic electroluminescent objects 100.

As describe above, the light-emitting display device and the method of making the same as described in each embodiment of the present invention have at least the following characteristics: Firstly, the connecting wires respectively connected with the soldering pad regions which are correspondingly in connection with the power pin and the light signal pins of the inorganic electroluminescent objects can be arranged in different layers not sharing the same plane. In this manner, the space for arranging the wires connecting the power pin can be enlarged, which in turn increases the electrical conductivity of the power connecting wires. Furthermore, in the enlarged space for wire arrangement, the power connecting wires can be divided into grid wiring lines with smaller linewidth, thereby increasing the aperture ratio of the display screen and in turn increasing the transparency. Secondly, the light signal connecting wires are overlapped with and electrically isolated from the power connecting wires to reduce the visibility of the light signal connecting wires. Third, the electrical insulative layers are employed to enable electrical isolation between the outgoing lines of the light signal connecting wires and the light signal connecting wires at different layers. In this manner, the outgoing lines of the light signal connecting wires can be arranged to be overlapped with the power connecting wires in the layout space, thereby reducing the visibility of the outgoing lines of the light signal connecting wires. Fourthly, a set of micro-size LED dies may be adopted as the inorganic electroluminescent objects to reduce their visibility in the display screen. Fifthly, the patterned conductive layers and the inorganic electroluminescent objects may be covered with the protective layer to avoid the external environment pollution and contact damage. The transparent protective layer may have a refractive index designed to increase the light emitted from the inorganic electroluminescent objects and reduce the light reflected by the screen substrate and therefore to avoid any person standing at the rear side of the transparent substrate from seeing the reflected light. Additionally, a second transparent substrate may be attached onto the transparent protective layer, and one or more than one anti-reflection films may be adhered to the second transparent substrate to reduce the light reflection of the emitting light of the light-emitting display device and the ambient light at the interface of the second transparent substrate and the air, which similarly avoids the person standing at the rear side of the transparent substrate from seeing the reflected light. Finally, the screen printing and spray printing processes may be used to form the patterned conductive layers which are in electrical connection with the inorganic electroluminescent objects. In this case, near-infrared light may also be used to quickly cure the printed or sprayed patterned conductive layers, thereby shortening the process time and facilitating the procedures. In sum, the visibility of all the connecting wires on the transparent substrate in the display screen may be reduced and therefore the aperture-ratio can be increased, which in turn improves the contrast and clarity of viewing such light-emitting display device in a distance. Moreover, materials of each of the patterned conductive layers may be selected according to a desired process. Thus, a flexible design for the process is possible. For example, the grid wiring lines, the slender wiring lines and the pad-connecting portions may be made of a material of electrically conductive powder mixed ink, with an addition for chemical plating. The grid wiring lines, the slender wiring lines and the pad-connecting portions may also be high-transparent indium tin oxide (ITO), fluorine-doped tin oxide (FTO), zinc oxide (ZnO), aluminum-doped zinc oxide (AZO), copper, silver, nickel, nickel gold, graphene, or carbon-nanotube.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A light-emitting display device mounted with a plurality of inorganic electroluminescent objects in form of an array with the inorganic electroluminescent objects being spaced from one another in a distance of at least 2 mm and with each of the inorganic electroluminescent objects being a combination of at least three LED components respectively emitting red light, green light, and blue light and having one power pin and light signal pins for the red light, the green light, and the blue light, comprising:

a first transparent substrate having a first surface, a second surface facing an opposite side of the first surface, and a plurality of through holes defined between the first surface and the second surface with the through holes being electrically conductive;

a first patterned conductive layer having a plurality of groups of non-overlapping soldering pad regions disposed on the first surface of the first transparent substrate, each group of the non-overlapping soldering pad regions including a first soldering pad region, a second soldering pad region, a third soldering pad region, and a fourth soldering pad region, and the first soldering pad region, the second soldering pad region, the third soldering pad region, and the fourth soldering pad region being disposed next to but electrically isolated from one another to be correspondingly in electrical connection with the power pin and the light signal pins, each group of the soldering pad regions further including a plurality of pad-connecting portions spaced from one another and respectively connected to the first soldering pad region, the second soldering pad region, the third soldering pad region, and the fourth soldering pad region, and wherein one of the first, second, third, and fourth soldering pad regions is adjacent to one of the through holes, and wherein each of the pad-connecting portions is connected to one of the through holes; and a second patterned conductive layer disposed on top of the second surface of the first transparent substrate and electrically connected to one of the pad-connecting portions by means of one of the through holes.

2. The light-emitting display device of claim 1, wherein the first patterned conductive layer further has a group of grid wiring lines ranging from 10 to 100 um in linewidth and including parts respectively laying along a first direction and a second direction crossing with each other, and each group of the grid wiring lines is in connection with the pad-connecting portion of the first soldering pad region; the pad-connecting portions of the second soldering pad region, the third soldering pad region, and the fourth soldering pad region are spaced from the grid wiring lines and each is connected to one of the through holes; the second patterned conductive layer further has a plurality of first slender wiring lines laying along the first direction and having one end connecting to one of the through holes; the first slender wiring lines are partially overlapped with the parts of the grid wiring lines laying along the first direction.

3. The light-emitting display device of claim 2, further comprising:
a third patterned conductive layer having a plurality of second slender wiring lines laying along the second direction with one end connecting to one of the through holes, disposed on top of the second surface of the first transparent substrate; and
a first patterned electrically insulative layer having a plurality of first electrically insulative segments to electrically insulate the second slender wiring lines from the first slender wiring lines, disposed between the second patterned conductive layer and the third patterned conductive layer;
wherein the second slender wiring lines are partially overlapped with the parts of the grid wiring lines laying along the second direction.

4. The light-emitting display device of claim 1, wherein the first patterned conductive layer further includes at least three spaced third slender wiring lines respectively in connection with the pad-connecting portions of the second soldering pad region, the third soldering pad region, and the fourth soldering pad region; the second patterned conductive layer includes a group of grid wiring lines of 10 um to 100 um in linewidth; and the pad-connecting portion of the first soldering pad region is in electrical connection with a junction of the grid wiring lines of the second patterned conductive layer by means of one of the through holes.

5. The light-emitting display device of claim 4, further comprising:

a fourth patterned conductive layer having fourth slender wiring lines being spaced from one another, laying along a direction crossing with the laying direction of the third slender wiring lines, and connecting respectively to the third slender wiring lines at one end and to a plurality of light-emitting signal input terminals at the other end, disposed on top of the first surface of the first transparent substrate and electrically isolated from the first patterned conductive layer; and a second patterned electrically insulative layer having a plurality of electrically insulative segments to electrically insulate the fourth slender wiring lines from the third slender wiring lines, disposed between the first patterned conductive layer and the fourth patterned conductive layer.

6. The light-emitting display device of claim 4, further comprising:
a patterned conductive metallic seed layer having the same patterns as the patterns of the first patterned conductive layer or the second patterned conductive layer, formed on top of the first surface or the second surface of the first transparent substrate for formation of the first patterned conductive layer or the second patterned conductive layer.

7. The light-emitting display device of claim 4, wherein the grid wiring lines of the second patterned conductive layer are made of a material selected from a group consisting of electrically conductive powder mixed ink, indium tin oxide (ITO), fluorine-doped tin oxide (FTO), zinc oxide (ZnO), aluminum-doped zinc oxide (AZO), copper, silver, nickel, and electroless nickel immersion gold.

8. The light-emitting display device of claim 1, further comprising:
a transparent protective layer disposed one top of the first patterned conductive layer and the inorganic electroluminescent objects, wherein the top surface of the transparent protective layer is higher than the light-emitting surfaces of the inorganic electroluminescent objects, the material of the transparent protective layer fills the spaces within the first patterned conductive layer to the extent that the first patterned conductive layer and the inorganic electroluminescent objects are entirely covered by the transparent protective layer, and the refractive index of the transparent protective layer is larger than or equal to the refractive index of the light-emitting surfaces of the inorganic electroluminescent objects.

9. The light-emitting display device of claim 8, further comprising:
a second transparent substrate disposed on top of the transparent protective layer and fitted to the top surface of the transparent protective layer, wherein the refractive index of the second transparent substrate is greater than or equal to the refractive index of the transparent protective layer.

10. The light-emitting display device of claim 9, further comprising:
at least one anti-reflective film disposed on the top surface of the second transparent substrate, wherein the refractive index of the anti-reflective film is less than or equal to the refractive index of the second transparent substrate and greater than or equal to the refractive index of the air.

11. The light-emitting display device of claim 1, wherein the first transparent substrate is made of a material selected from a group consisting of glass, ceramic, aluminum nitride ceramics, polycarbonate, ethylene-tetrafluoroethylene (ETFE), polyethylene terephthalate (PET), polyethylene naphthalate (PEN), polyethylene glycol (PEG), polyimide (PI), polymethyl methacrylate (PMMA), bismaleimide triazine resin, glass fiber, and cyclic olefin copolymer.

12. A method of manufacturing the light-emitting display device of claim 1, comprising:
providing a first transparent substrate having a plurality of through holes defined between a first surface and a second surface of the first transparent substrate, wherein the second surface faces the opposite side of the first surface;
plating or filling the through holes with electrically conductive materials;
forming a first patterned conductive layer on top of the first surface of the first transparent substrate with the first patterned conductive layer including a plurality of groups of non-overlapping soldering pad regions, wherein each group of the non-overlapping soldering pad regions includes a first soldering pad region, a second soldering pad region, a third soldering pad region, and a fourth soldering pad region disposed next to but electrically isolated from one another to be correspondingly in electrical connection with the power pin and the light signal pins of one of the inorganic electroluminescent objects, and each group of the soldering pad regions further includes a plurality of pad-connecting portions spaced from one another and respectively connected to the first soldering pad region, the second soldering pad region, the third soldering pad region, and the fourth soldering pad region, and wherein one of the first, second, third, and fourth soldering pad regions is adjacent to one of the through holes, and wherein each of the pad-connecting portions is connected to one of the through holes;
forming a second patterned conductive layer on top of the second surface; and
electrically connecting the second patterned conductive layer to one of the pad-connecting portions by means of one of the through holes.

13. The method of claim 12, wherein the first patterned conductive layer is further formed with a group of grid wiring lines including parts respectively laying along a first direction and a second direction crossing with each other; the second patterned conductive layer is further formed with a plurality of first slender wiring lines laying along the first direction and having one end connecting to one of the through holes; and the first slender wiring lines are formed to be partially overlapped with the parts of the grid wiring lines laying along the first direction.

14. The method of claim 13, further comprising:
forming on top of the second patterned conductive layer with a first patterned electrically insulative layer having a plurality of first electrically insulative segments; and
forming on top of the first patterned electrically insulative layer with a third patterned conductive layer having a plurality of second slender wiring lines laying along the second direction with one end connecting to one of the through holes;
wherein the first electrically insulative segments electrically isolate the second slender wiring lines from the first slender wiring lines, and the second slender wiring lines are partially overlapped with the parts of the grid wiring lines laying along the second direction.

15. The method of claim 14, wherein the third patterned conductive layer is formed in a process of screen printing or spray printing.

16. The method of claim 13, wherein the pad-connecting portion of the first soldering pad region is in connection with the grid wiring lines of the first patterned conductive layer while the pad-connecting portions of the second soldering pad region, the third soldering pad region, and the fourth soldering pad region are separated from the grid wiring lines of the first patterned conductive layer and respectively in connection with one of the through holes.

17. The method of claim 12, wherein the first patterned conductive layer is further formed with at least three spaced third slender wiring lines respectively in connection with the pad-connecting portions of the second soldering pad region, the third soldering pad region, and the fourth soldering pad region; the second patterned conductive layer is formed with a group of grid wiring lines; and the pad-connecting portion of the first soldering pad region is in electrical connection with a junction of the grid wiring lines of the second patterned conductive layer by means of one of the through holes.

18. The method of claim 17, further comprising:
forming on top of the first patterned conductive layer with a second patterned electrically insulative layer having a plurality of second electrically insulative segments; and
forming on top of the second patterned electrically insulative layer with a fourth patterned conductive layer having fourth slender wiring lines being spaced from one another, laying along a direction crossing with the laying direction of the third slender wiring lines, and connecting respectively to the third slender wiring lines at one end and connecting respectively to a plurality of light-emitting signal input terminals at the other end;
wherein the second electrically insulative segments electrically isolate the third slender wiring lines from the fourth slender wiring lines.

19. The method of claim 17, further comprising:
forming on top of the first surface or the second surface of the first transparent substrate with a patterned conductive metallic seed layer in a process of sputtering, screen printing, or spray printing;
wherein the first patterned conductive layer or the second patterned conductive layer is formed on top of the patterned conductive metallic seed layer in a process of sputtering, etching, electroless plating, or electroplating, and one end of the through holes which is on the first surface of the transparent plate is plated with materials of the pad-connecting portion of the first soldering pad region.

20. The method of claim 12, wherein one of the first patterned conductive layer and the second patterned conductive layer is formed in a process of screen printing or spray printing.

* * * * *